(12) United States Patent  (10) Patent No.: US 9,401,227 B2
Noh  (45) Date of Patent: Jul. 26, 2016

(54) POST PACKAGE REPAIR DEVICE

(71) Applicant: SK hynix Inc., Icheon-si Gyeonggi-do (KR)

(72) Inventor: Young Kyu Noh, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/684,608

(22) Filed: Apr. 13, 2015

(65) Prior Publication Data

US 2016/0180969 A1 Jun. 23, 2016

(30) Foreign Application Priority Data

Dec. 18, 2014 (KR) .................. 10-2014-0183247

(51) Int. Cl.
*G11C 17/00* (2006.01)
*G11C 29/00* (2006.01)
*G11C 17/16* (2006.01)
*G11C 17/18* (2006.01)

(52) U.S. Cl.
CPC ................ *G11C 29/78* (2013.01); *G11C 17/16* (2013.01); *G11C 17/18* (2013.01)

(58) Field of Classification Search
CPC .............................. G11C 29/812; G11C 17/16
USPC ........................................ 365/200, 225.7, 96
See application file for complete search history.

(56) References Cited

U.S. PATENT DOCUMENTS 6,898,143 B2 * 5/2005 Puri .................. G11C 29/4401
365/225.7
2014/0078842 A1 3/2014 Oh et al.

FOREIGN PATENT DOCUMENTS

KR 1020070082815 A 8/2007

* cited by examiner

*Primary Examiner* — Son Mai
(74) *Attorney, Agent, or Firm* — William Park & Associates Ltd.

(57) ABSTRACT

A post package repair device may include a plurality of bank groups, each of the plurality of bank groups including fuses indicating repair information, configured to share a predetermined number of fuses. The post package repair device may include a resource detection unit configured to determine the availability of the fuses from among the plurality of bank groups.

20 Claims, 12 Drawing Sheets

POST PACKAGE REPAIR DEVICE

CROSS-REFERENCE TO RELATED APPLICATION

This application claims priority based upon Korean patent application No. 10-2014-0183247, filed on Dec. 18, 2014, the disclosure of which is hereby incorporated in its entirety by reference herein.

BACKGROUND

1. Technical Field

Embodiments of the present disclosure generally relate to a post package repair device, and more particularly to a technology for outputting resource information of a fuse configured to repair a post package to an external part.

2. Related Art

A Dynamic Random Access Memory (DRAM) includes a plurality of memory cells arranged in the form of a matrix. However, if a defective or failed cell occurs in at least one memory cell from among a plurality of memory cells, it may be impossible for a semiconductor memory device to operate normally. So much so that the semiconductor memory device having the defective cell may be regarded as a defective product and abandoned. Semiconductor memory devices are being developed to have a higher degree of integration and to operate at a higher speeds. Thus, there is a higher possibility of causing or creating defective cells.

As a result, a production yield denoted by the ratio of a total number of chips to the number of normal chips, which is needed for deciding production costs of DRAMs, is gradually reduced. Therefore, in order to increase a production yield of semiconductor memory devices, many developers and companies are conducting intensive research into a method for fabricating highly-integrated semiconductor memory devices configured to operate at a higher speed and methods for efficiently repairing defective cells.

As an exemplary method for repairing the defective cell, a technology for embedding a repair circuit configured to replace a defective cell with a redundancy cell, into the semiconductor memory device has been widely used. Generally, the repair circuit includes redundancy columns/rows including redundancy memory cells arranged in rows and columns. The repair circuit may select the redundancy column/row to substitute for the defective column/row.

That is, if a row and/or column address signal for designating a defective cell is input to the repair circuit, the repair circuit may select the redundancy column/row instead of the defective column/row of a memory cell bank.

In order to recognize an address for designating a defective cell, the semiconductor memory device may include a plurality of fuses capable of being blown. The fuses are selectively blown so that an address of the defective cell can be programmed.

A method for repairing a defective cell of DRAMs is classified into a method (hereinafter referred to as a wafer repair method) for repairing the defective cell in a wafer state and a method (hereinafter referred to as a packaging repair method) for repairing the defective cell in a packaging state.

In this case, the wafer repairing method performs testing of memory cells of the semiconductor memory device at a wafer level. The wafer repairing method replaces a defective cell with a redundancy cell. The packaging repair method performs testing of memory cells of the semiconductor memory device at a package state. The packaging repair method replaces a defective cell with a redundancy cell at the package state. The above-mentioned case repairing of the defective cell is performed at a package state is referred to as a Post Package Repair (PPR) method.

However, according to a circuit structure capable of being simultaneously replaced with redundancy word lines of two banks during a post package repair (PPR) operation, fuse resources can be simultaneously reduced. In addition, it may be impossible to recognize the presence or absence of the remaining fuses available to the PPR operation. In addition, it may be impossible for the fuse structure allocated to each independent bank to maximally use a plurality of fuses, and the rupture operation may be repeatedly performed irrespective of the remaining fuses during the PPR operation.

SUMMARY

In accordance with an embodiment, a post package repair device may include a plurality of bank groups, each of the plurality of bank groups including fuses indicating repair information, configured to share a predetermined number of fuses. The post package repair device may include a resource detection unit configured to determine the availability of the fuses from among the plurality of bank groups.

In accordance with an embodiment, a post package repair device may include an Array Rupture Electrical fuse (ARE) array unit having a fuse array configured to store a failed address. The post package repair device may include a boot-up controller configured to scan the fuse array during a post package repair (PPR) operation, and to output fuse resource information. The post package repair device may include a resource detection unit configured to store the fuse resource information, and to output a resource signal indicating the availability of the fuse. The post package repair device may include a rupture controller configured to control a rupture operation of the ARE array unit in response to a resource signal received from the resource detection unit.

DETAILED DESCRIPTION

Reference will now be made in detail to various embodiments of the present disclosure, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter.

Various embodiments of the present disclosure may be directed to providing a post package repair device that substantially obviates one or more problems due to limitations or disadvantages of the related art.

Embodiments of the present disclosure may relate to a post repair package device for outputting resource information needed for post package repairing to the outside.

Figure 1:
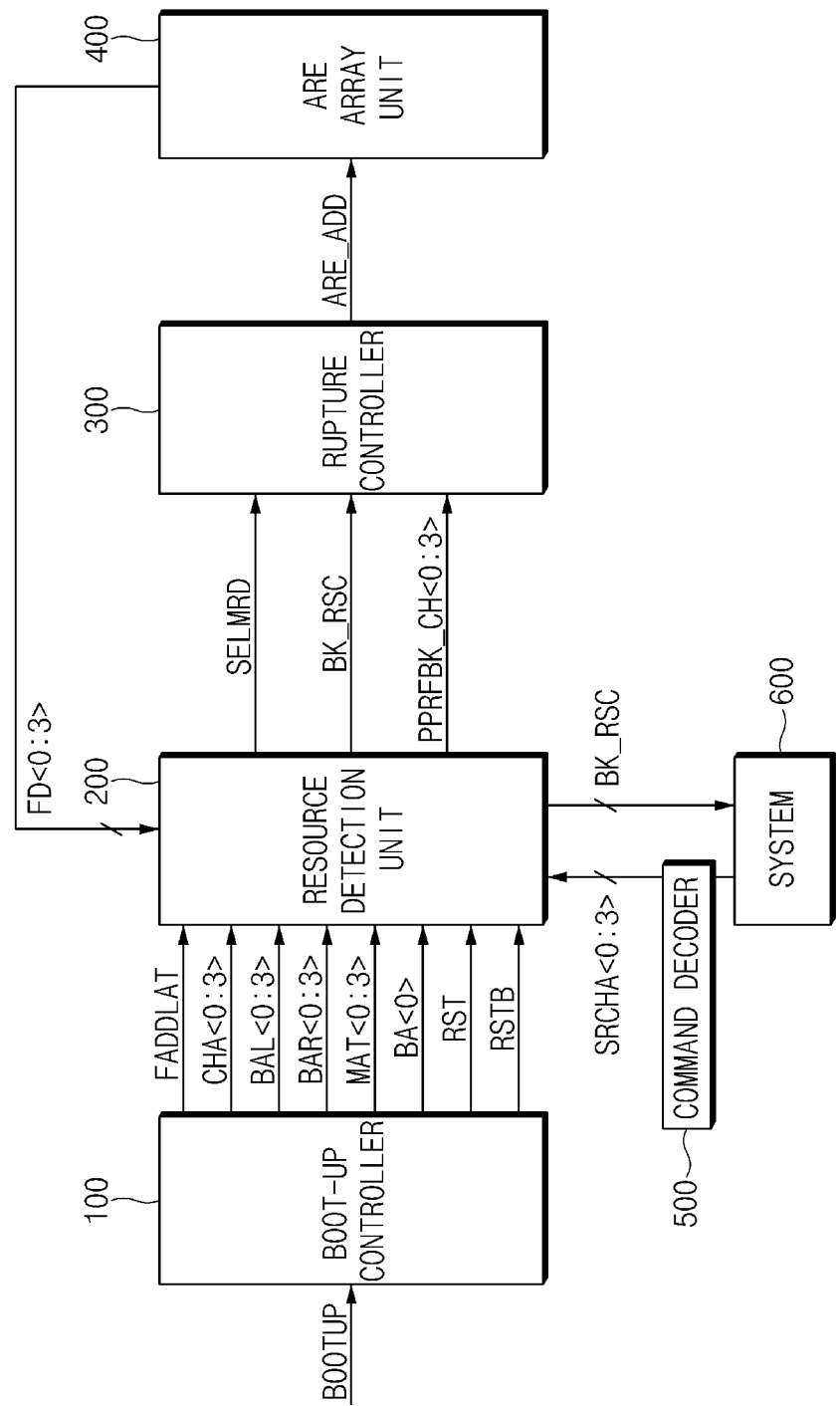
FIG. 1 is a block diagram illustrating an example of a representation of a post package repair device according to an embodiment.

FIG. 1 is a block diagram illustrating an example of a representation of a post package repair device according to an embodiment.

Referring to FIG. 1, the post package repair device according to an embodiment may include a boot-up controller 100, a resource detection unit 200, and a rupture controller 300. The post package repair device may include an Array Rupture Electrical fuse (ARE) array unit 400, a command decoder 500, and a system 600.

In an embodiment, the boot-up controller 100 may scan fuses to be used for the post package repair (PPR) operation, and may output the scanned fuse resource information to the resource detection unit 200. In an embodiment, the boot-up controller 100 may output the prestored fuse resource information as 1-bit information using a Mode Register Set (MRS).

The boot-up controller 100 may initiate the boot-up operation in response to a boot-up signal (BOOTUP), and may output an address (FADDLAT) indicating the position of a fuse line in response to the counting operation.

The boot-up controller 100 may output a channel selection signal CHA<0:3> needed for reading information indicating which channel has an unused fuse. The boot-up controller 100 may output a bank selection signal BAL<0:3> needed for reading fuse use information of a left region and a right region in each bank. The boot-up controller 100 may output a mat selection signal MAT<0:3> needed for reading information indicating which mat has an unused fuse within each bank.

The boot-up controller 100 may output a bank-group selection signal BA<0> needed for reading specific information indicating which region has an unused fuse within each bank. The boot-up controller 100 may output reset signals (RST, RSTB) for resetting data stored in each bank. In an embodiment, the reset signal (RSTB) is an inversion signal of the reset signal (RST).

The boot-up controller 100 may scan fuse data regarding a failed address stored in an electrical fuse of the ARE array unit 400, prior to operating the memory upon completion of a power-up operation.

The boot-up controller 100 scans row or column fuse information ruptured in the ARE array unit 400, and thus an address (FADDLAT) indicating the used or unused state of the fuses to the resource detection unit 200. In an embodiment, during the boot-up operation, the boot-up controller 100 may search for each fuse region in all banks of the ARQ array unit 400. The use information of the fuse set is output to the resource detection unit 200.

In order to recognize information as to whether the last user of the semiconductor device uses the fuses, a Post Package Repair (PPR) function may be needed. For example, it may be necessary for the semiconductor device to include electrical fuses therein, and it may also be necessary for the semiconductor device to include a resource detection unit 200 configured to recognize whether the fuse is available or not. If the fuse for PPR is present, the resource detection unit 200 may inform the external system 600 of resource information for each fuse.

For example, the resource detection unit 200 may store resource information for each fuse to detect the number of fuses unused in the boot-up operation. The resource detection unit 200 may latch resources of all fuses either in several channels or in several banks of each channel during the boot-up operation. The user can discard the PPR fuse resource information, and can determine whether the rupture operation is performed per channel or per bank using the prestored fuse data FD<0:3> during the PPR operation.

The resource detection unit 200 may select the corresponding channel in response to a channel selection signal CHA<0:3>, and may select the corresponding mat in response to a mat selection signal MAT<0:3>. The resource detection unit 200 may detect not only resource information of a bank group arranged in an UP region but also resource information of a bank group arranged in a DOWN region in response to a bank group selection signal BA<0>. The resource detection unit 200 may select a left or right region of each bank in response to the bank selection signal BAL<0:3> or BAR<0:3>.

The resource detection unit 200 may detect resource information of each bank in response to the address (FADDLAT), and may output a rupture control signal (SELMRD), a resource signal (PPRFBK_CH<0:3>), and a masking signal (BK_RSC) to the rupture controller 300. In an embodiment, the resource detection unit 200 may output the rupture control signal (SELMRD) to the rupture controller 300 in response to an output control signal SRCHA<0:3>. In an embodiment, the output control signal SRCHA<0:3> is requested by the system 600 to perform the rupture operation.

The resource detection unit 200 may reset the stored resource detection information in response to the reset signals (RST, RSTB). The resource detection unit 200 may receive fuse data FD<0:3> from the ARE array unit 400, compare the received fuse data FD<0:3> with read data received from the boot-up controller 100, and determine whether the fuse is used. If there is no unused fuse, the resource detection unit 200 may output a masking signal (BK_RSC) to the rupture controller 300 to prevent the rupture operation from being repeatedly performed.

Upon receiving the rupture control signal (SELMRD), a resource signal PPRFBK_CH<0:3>, and a masking signal (BK_RSC) from the resource detection unit 200, the rupture controller 300 may output an address ARE_ADD for controlling the rupture operation of the electrical fuses contained in the ARE array unit 400.

As respective constituent elements of the semiconductor integrated circuit (IC) device become super-miniaturized in size and the number of elements contained in one semiconductor chip increases, the level of defect density also increases. The increasing defect density may directly deteriorate a production yield or productivity of the semiconductor devices. If the defect density excessively increases, wafers in which the semiconductor device is formed must be discarded and abandoned.

In order to deteriorate the defect density, a redundancy circuit for replacing the defective cell with a redundancy cell may be proposed. The redundancy circuit (or a fuse circuit) may be installed into each of a row-based line (e.g., word line) and a column-based line (e.g., bit line) of the semiconductor memory device.

The redundancy circuit may include an ARE array unit 400 configured to store address information of a defective cell. The ARE array unit 400 may include a plurality of fuse sets, each of the plurality of fuse sets may include a plurality of fuse lines. The ARE array unit 400 is a memory that stores information of respective bits of all failed addresses therein. The ARE array unit 400 may select the corresponding row line in response to the address ARE_ADD indicating fuse selection information.

Respective fuse-sets may be configured to perform information programming by melting the fuse due to the occurrence of an overcurrent. Each fuse-set may perform self repairing (i.e., repair or rupture) so as to relieve or save failed bits in a memory package state.

Upon completion of memory testing, the ARE array unit 400 may apply the testing result information to the memory, and the ARE array unit 400 may rupture the electrical fuse corresponding to each bit so that the ARE array unit 400 stores information (i.e., failure information) regarding the failed parts. The ARE array unit 400 may output the previously stored row fuse data and column fuse data, prior to operating the memory upon completion of the power-up operation.

If the address ARE_ADD is activated, the ARE array unit 400 may store address information of a defective cell according to the rupture operation. For example, each fuse-set may be implemented as an electrical fuse (E-fuse) that performs information programming by melting the fuse due to the occurrence of an overcurrent.

The semiconductor device may initiate the boot-up operation to read information of the ARE array unit 400 in response to a power-up signal. Bit information of the accessed fuse-set may be loaded on fuse data FD<0:3>, and may be sequentially output to the resource detection unit 200.

The ARE array unit 400 may sequentially read a plurality of fuse-sets from a first fuse-set to the last fuse-set. If the read operation of the ARE array unit 400 is performed, defective-cell address information stored in the fuse-sets from the first fuse-set to the last fuse-set can be sequentially or simultaneously read.

The command decoder 500 may decode the command signal received from the system 600, and may output the output control signal SRCHA<0:3> to the resource detection unit 200.

The system 600 may receive masking signal (BK_RSC) from the resource detection unit 200.

Figure 2:
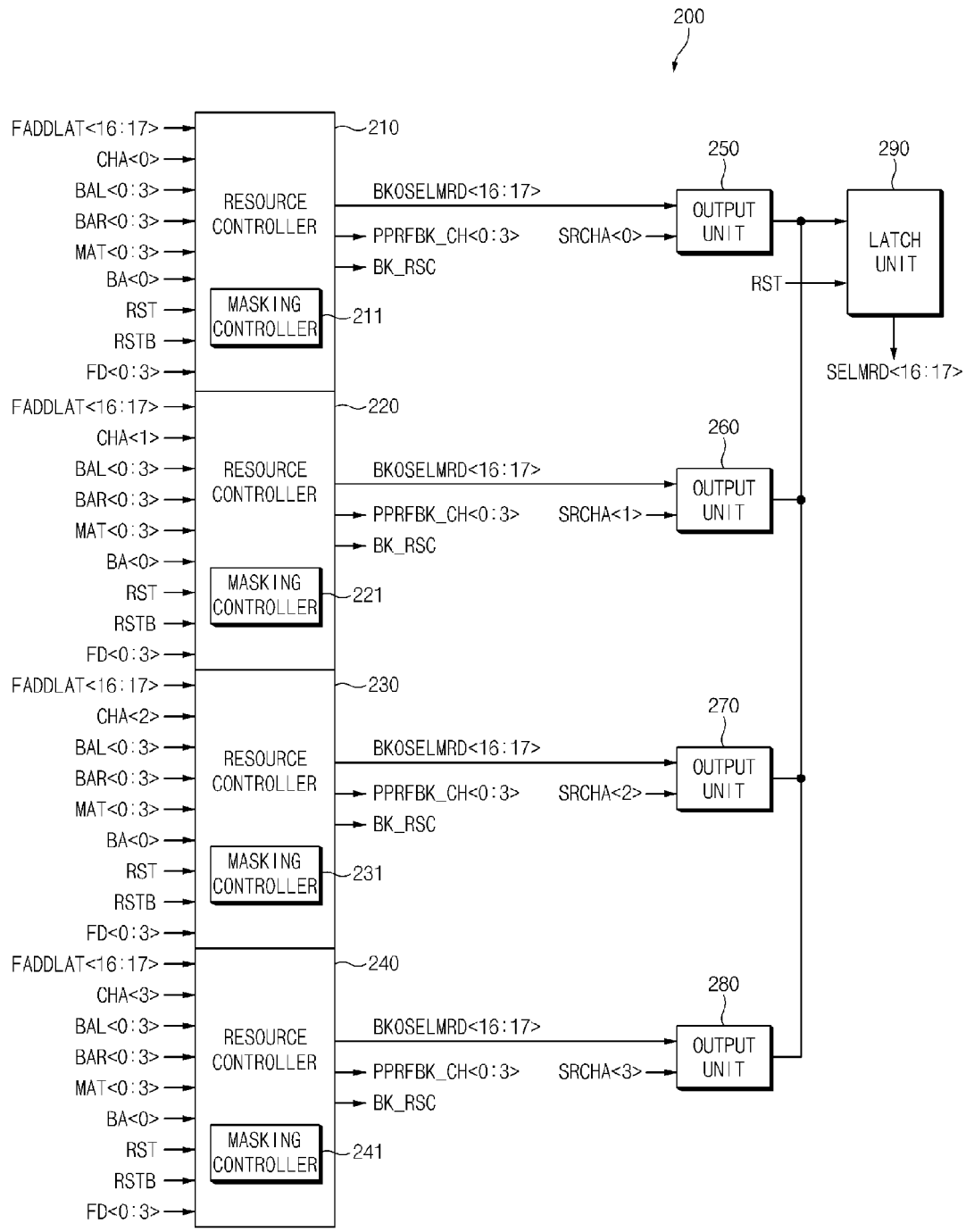
FIG. 2 is a detailed block diagram illustrating an example of a representation of a resource detection unit illustrated in FIG. 1.

FIG. 2 is a detailed block diagram illustrating an example of a representation of the resource detection unit 200 illustrated in FIG. 1.

Referring to FIG. 2, the resource detection unit 200 may include a plurality of resource controllers (210~240), a plurality of output units (250~280), and a latch unit 290. In an embodiment, the resource controllers (210~240) may include a plurality of masking controllers (211, 221, 231, 241), respectively.

The resource controllers (210~240) may latch the ARE address of the PPR fuse region allocated to the boot-up operation. The resource controllers (210~240) may classify the received data into a plurality of regions according to respective channels, respective banks, and respective mats, so that the resource controllers (210~240) can read resource data according to the classified result.

The resource controllers (210~240) may receive the address FADDLAT (i.e., FADDLAT<16:17>, the channel selection signal CHA<0:3>, the mat selection signal MAT<0:3>, the back-group selection signal BA<0>, the bank selection signal BAL/R<0:3>, and the reset signals (RST, RSTB) from the boot-up controller 100. The resource controllers (210~240) may receive fuse data FD<0:3> from the ARE array unit 400, and may compare the fuse data FD<0:3> with fuse data FD received from the boot-up controller 100.

For example, the resource controllers (210~240) may select one channel in response to the channel selection signal CHA<0:3>, may select a bank group in response to the bank-group selection signal BA<0>, and may select a mat in response to the mat selection signal MAT<0:3>. For example, the resource controllers (210~240) may select a left bank or a right bank in response to the bank selection signal (BAL<0:3> or BAR<0:3>), and may select the address FADDLAT in the selected bank.

The resource controllers (210~240) may output a selection signal BKOSELMRD<16:17> having selection information of each channel to the output units (250~280), respectively. The resource controllers (210~240) may output a resource signal PPRFBK_CH<0:3> having resource information corresponding to each channel to the rupture controller 300. In order to prevent the rupture operation from being repeatedly performed when there is no unused fuse, the masking controllers (211, 221, 231, 241) may output a masking signal (BK_RSC) to the rupture controller 300 and the system 600 (see FIG. 1).

The output units (250~280) may store a selection signal BKOSELMRD<16:17> received from the resource controllers (210~240), respectively. The output units (250~280) may selectively output the stored signal to the latch unit 290 in response to activation or deactivation of the output control signal SRCHA<0:3> received from the system 600 (see FIG. 1).

For example, if the output control signal SRCHA<0> is enabled or activated, the signal received from the resource controller 210 is output to the latch unit 290 through the output unit 250. If the output control signal SRCHA<1> is enabled or activated, the signal received from the resource controller 220 is output to the latch unit 290 through the output unit 260. If the output control signal SRCHA<2> is enabled or activated, the signal received from the resource controller 230 is output to the latch unit 290 through the output unit 270. If the output control signal SRCHA<3> is enabled or activated, the signal received from the resource controller 240 is output to the latch unit 290 through the output unit 280.

The latch unit 290 may latch the output signals of the output units (250~280) for a predetermined period of time, and may output a rupture control signal SELMRD (i.e., SELMRD<16:17>). The latch unit 290 may reset the stored information in response to the reset signal RST.

Figure 3:
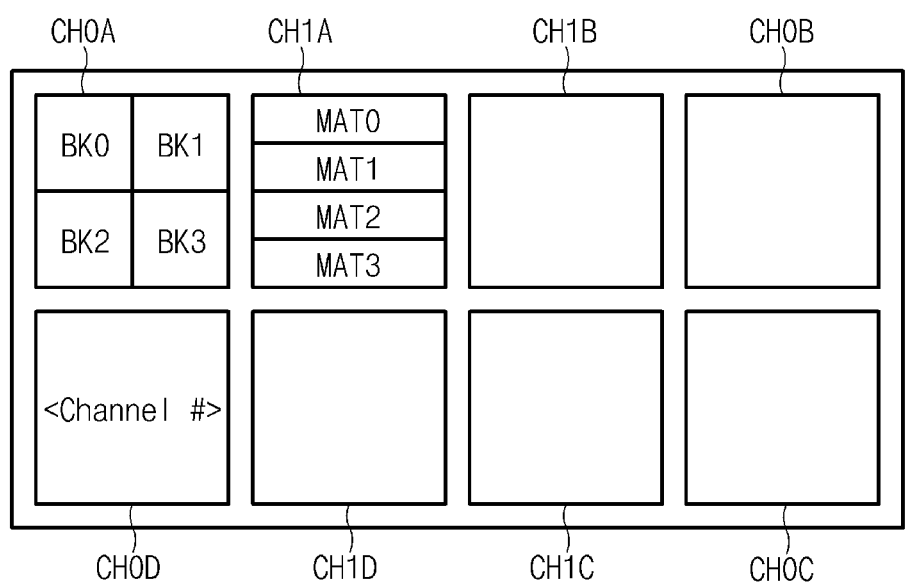
FIG. 3 is a detailed block diagram illustrating an example of a representation of channels according to an embodiment.

FIG. 3 is a detailed block diagram illustrating an example of a representation of channels according to an embodiment.

Referring to FIG. 3, a multi-channel structure may include a plurality of channels (CH0A~CH0D) and a plurality of channels (CH1A~CH1D). For example, the channels (CH0A~CH0D) of a first group may be arranged at the outermost region, and the channels (CH1A~CH1D) of a second group may be arranged at the center region.

Although the embodiments of the present disclosure have, for example, disclosed 8 channels for convenience of description and better understanding of the present disclosure, the scope or spirit of the present disclosure is not limited thereto, and the number of channels and the arrangement relationship of channels may also be modified as necessary.

Each of the channels (CH0A~CH0D) may include a plurality of banks (BK0~BK3). For example, in Channel CH0A, Bank BK0 is arranged at a left upper region, and Bank BK1 is arranged at a right upper region. In Channel CH0A, Bank BK2 is arranged at a left lower region, and Bank BK3 is arranged at a right lower region.

Although the embodiments of the present disclosure have, for example, disclosed four banks contained in one channel for convenience of description and better understanding of the present disclosure, the scope or spirit of the present disclosure is not limited thereto, and the number of banks and the arrangement relationship of banks may also be modified as necessary.

In addition, each of the channels (CH0A~CH0D) may include a plurality of mats (MAT0~MAT3). For example, one channel CH0A may be classified into four mats (MAT0~MAT3) sequentially arranged.

Although the embodiments of the present disclosure have, for example, disclosed four mats contained in one channel for convenience of description and better understanding of the present disclosure, the scope or spirit of the present disclosure is not limited thereto, and the number of mats and the arrangement relationship of banks may also be modified as necessary.

Fuse information generated from the ARE array unit 400 may be applied to the channels (CH0A~CH0D) through a row decoder and a repair unit, and the repair operation is performed in response to the fuse information.

Figure 4:
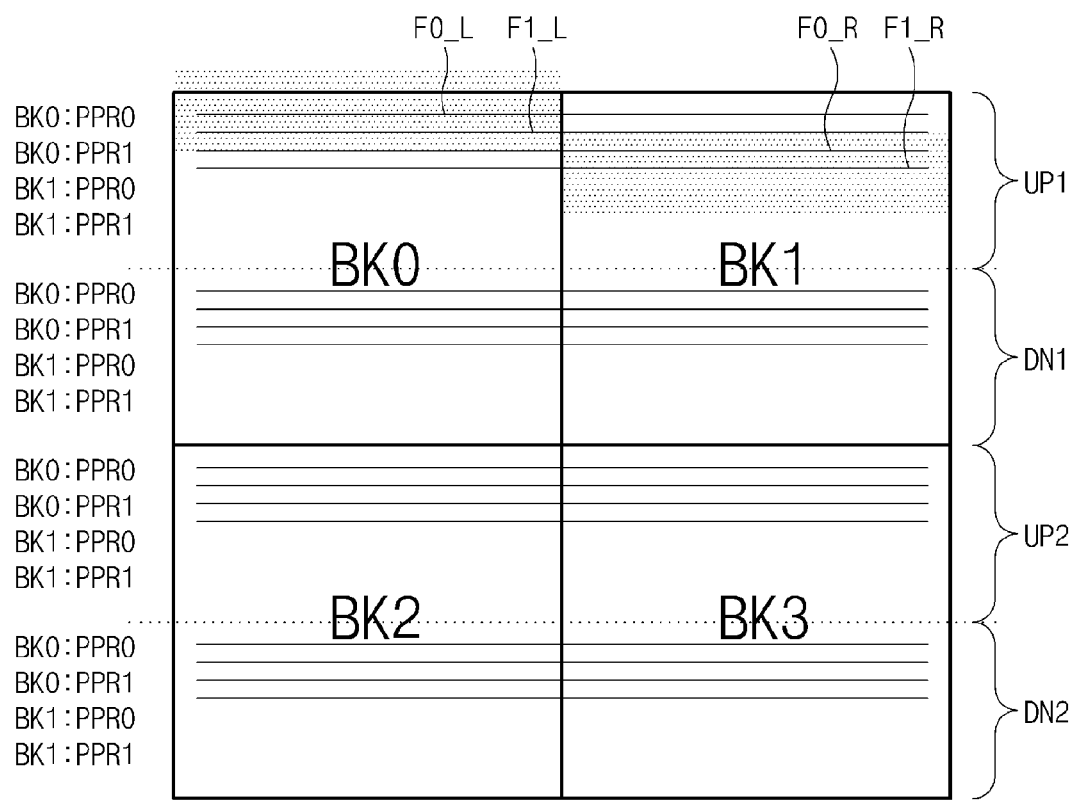
FIG. 4 is a detailed block diagram illustrating an example of a representation of a channel illustrated in FIG. 3.

FIG. 4 is a detailed block diagram illustrating an example of a representation of the channel CH0A illustrated in FIG. 3.

Referring to FIG. 4, one channel CH0A may include a plurality of banks (BK0~BK3). For example, two upper banks (BK0, BK1) from among the banks (BK0~BK3) are defined as one bank group, and two lower banks (BK2, BK3) are defined as the other bank group. In an embodiment, each of the banks (BK0~BK3) may include fuse lines allocated for the PPR (Post Package Repair) operation.

If the user desires to use the PPR function, the remaining unused fuses are needed so that the user can use the PPR function and the fuse having used the previous PPR can normally operate without any problems. If the fuse to be used for PPR is not present, the previously-used fuse may malfunction and it is difficult to recognize whether the repairing function is failed or there is no fuse. During the row repairing mode, if redundancy word lines of two banks are simultaneously replaced, the number of fuse resources is reduced by one, and redundancy word lines of two banks are reduced, so that the amount of resources can be reduced to an undesired bank.

Two banks are shared by one group during the test mode, so that fuse lines can be shared. Banks can be classified according to the order of fuse lines. Although two banks are shared, fuses can be controlled per bank. According to the embodiments, even when row word lines are simultaneously replaced, resources of respective banks can be output irrespective of simultaneous replacement. Even in the example of using the fuse repair scheme in which two banks are simultaneously replaced, PPR may not affect fuse resources of other banks.

For example, Banks (BK0, BK1) of a first group contained in the upper region UP1 may share fuse lines (F0_L, F1_L, F0_R, F1_R) arranged in a row direction. In an embodiment, the upper region UP1 may correspond to the mat MAT0. Banks (BK0, BK1) contained in a lower region DN1 may share the fuse lines arranged in a row direction. In an embodiment, the lower region DN1 may correspond to the mat MAT1. In accordance with the embodiments, one mat is divided into a plurality of regions in units of 8 K, and fuses may be allocated to the divided regions.

Banks (BK2, BK3) of a second group contained in the upper region UP2 may share fuse lines arranged in the row direction. In an embodiment, the upper region UP2 may correspond to the mat MAT2. Banks (BK2, BK3) contained in a lower region DN2 may share fuse lines arranged in the row direction. The lower region DN2 may correspond to the mat MAT3.

Bank BK0 and Bank BK1 may be shared in an embodiment. Fuse lines (F0_L, F1_L) of Bank BK0 and fuse lines (F0_R, F1_R) of Bank BK1 are distinguished from each other so that the independent repair operation can be performed. For example, even when two banks are simultaneously replaced using only one fuse, the PPR fuse must reduce only resources of the repaired bank.

Although the embodiments of the present disclosure have, for example, disclosed four fuse lines on the basis of each mat for convenience of description and better understanding of the present disclosure, the scope or spirit of the present disclosure is not limited thereto, and the number of fuse lines contained in each mat may be changed as necessary.

The fuse lines allocated to the upper regions of respective banks (BK0~BK3) are defined as BK0, PPR0, and PPR1, respectively. The fuse lines allocated to the lower regions of respective banks (BK0~BK3) are defined as BK1, PPR0, and PPR1, respectively.

For example, the fuse lines (F0_L, F1_L, F0_R, F1_R) may be shared by two banks (BK0, BK1). Two upper fuse lines (F0_L, F1_L) of the upper region UP1 are allocated to a left bank BK0, and two lower fuse lines (F0_R, F1_R) are allocated to a right bank BK1.

Figure 5:
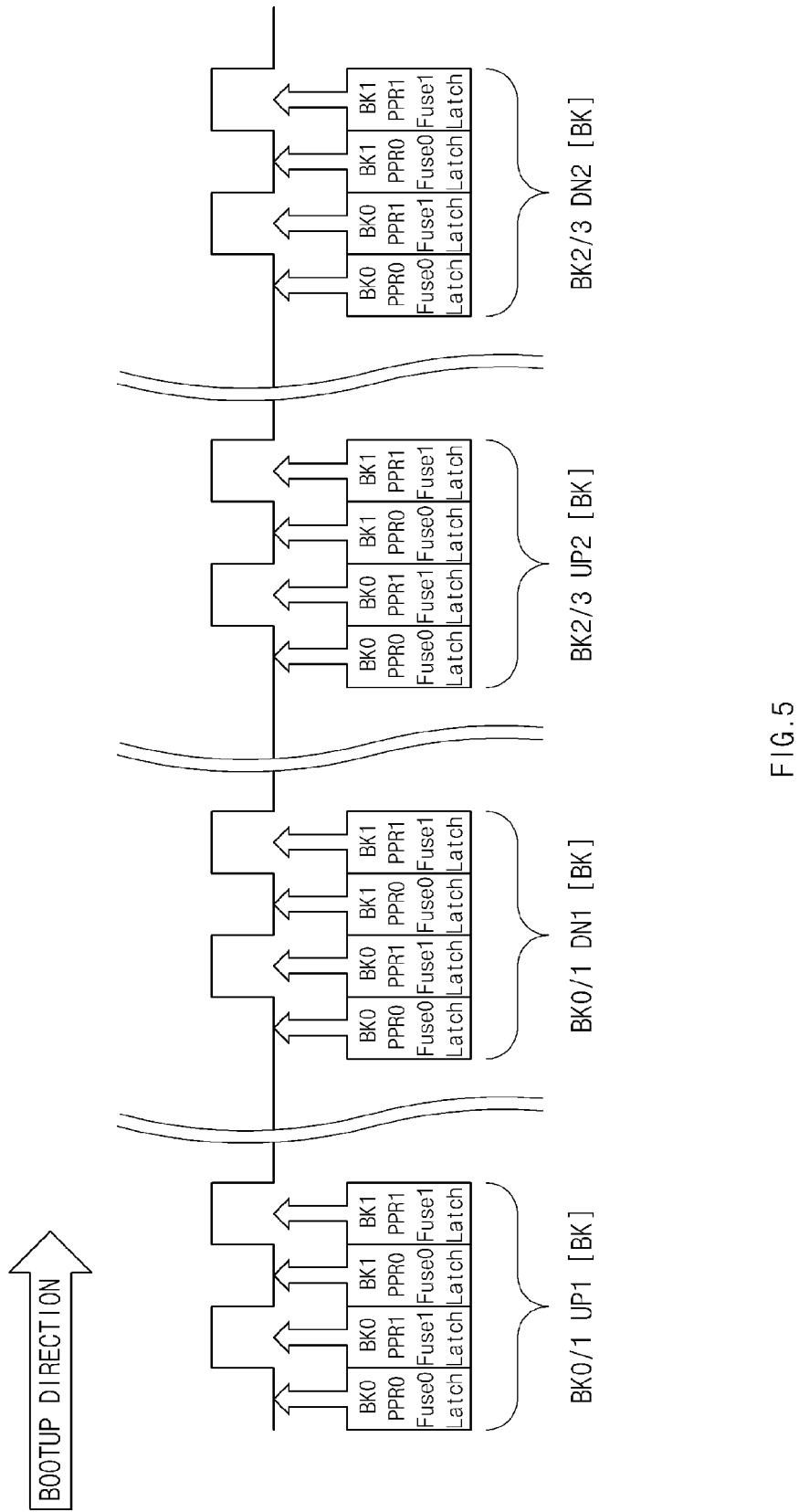
FIG. 5 is a conceptual diagram illustrating an example of a representation of a latch order of fuse lines at Channel (CH0A) illustrated in FIG. 4.

FIG. 5 is a conceptual diagram illustrating an example of a representation of a latch order of fuse lines at Channel (CH0A) illustrated in FIG. 4.

It may be assumed that the boot-up direction of the fuse lines proceeds from the left side to the right side. The resource controllers (210~240) (see FIG. 2) of Channel CH0A may be synchronized with a clock signal during the boot-up operation, so that the fuse lines of each bank can be sequentially latched.

The resource controllers (210~240) may latch the fuse lines contained in the upper region UP1 of the banks (BK0, BK1), and may latch the fuse lines contained in the lower region DN1 of the banks (BK0, BK1). Thereafter, the resource controllers (210~240) may latch the fuse lines contained in the upper region UP2 of the banks (BK2, BK3), and may latch the fuse lines contained in the lower region DN2 of the banks (BK2, BK3).

Figure 6:
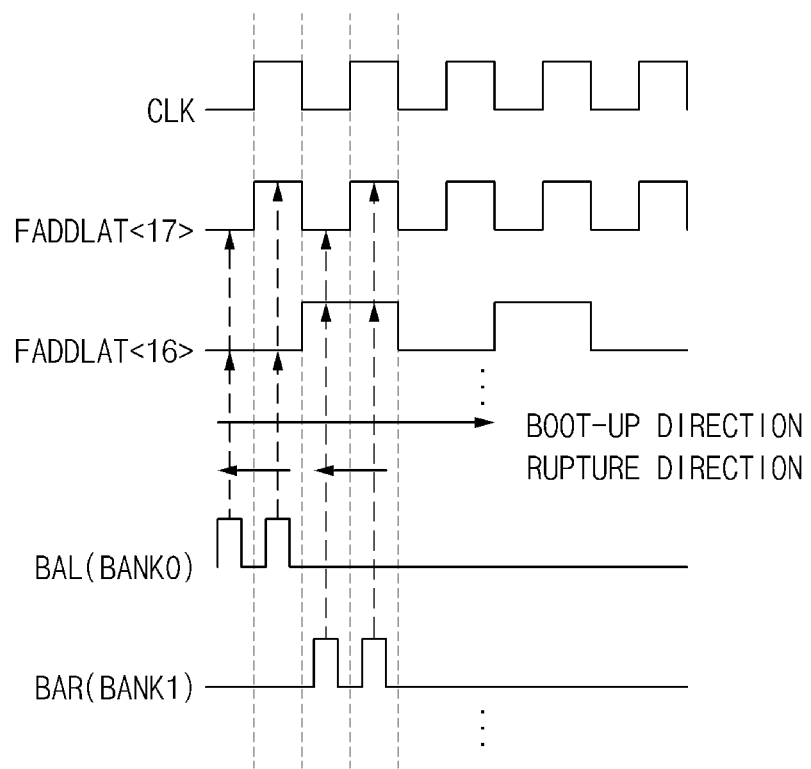
FIGS. 6 and 7 are conceptual diagrams illustrating examples of representations of a bank allocation method of fuses using a resource controller illustrated in FIG. 2.
Figure 7:
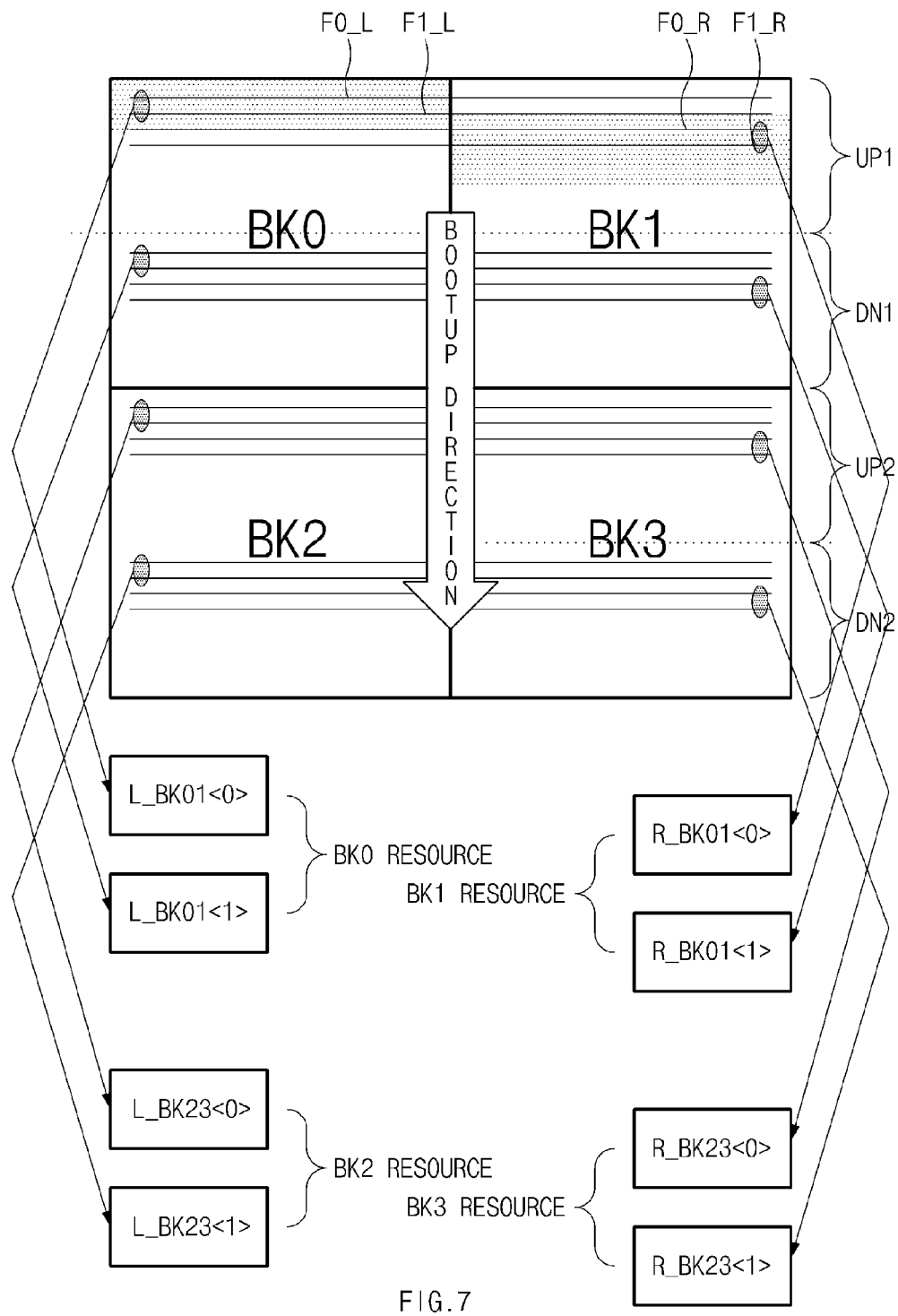

FIGS. 6 and 7 are conceptual diagrams illustrating examples of representations of a bank allocation method of fuses using the resource controllers (210~240) illustrated in FIG. 2.

The boot-up controller 100 (see FIG. 1) may perform the counting operation in response to the clock signal CLK, and may generate the address FADDLAT<16:17> for performing the PPR operation. The address FADDLAT<17> is input to the resource controllers in synchronization with the clock signal CLK, and the address FADDLAT<16> divided at intervals of a predetermined time (e.g., about two times) are sequentially input to the resource controllers.

If the bank selection signal BAL<0> is received from the ARE array unit 400, the left upper bank BK0 is selected. If the bank selection signal BAR<1> is received from the ARE array unit 400, the right upper bank BK1 is selected.

Referring to FIG. 7, the left bank L_BK01<0> of the upper region UP1 and the left bank L_BK01<1> of the lower region DN1 may read resource information of the bank BK0. The right bank R_BK01<0> of the upper region UP1 and the right bank R_BK01<1> of the lower region DN1 may read resource information of the bank BK1.

The left bank L_BK23<0> of the upper region UP2 and the left bank L_BK23<1> of the lower region DN2 may read resource information of the bank BK2. The right bank R_BK23<0> of the upper region UP2 and the right bank R_BK23<1> of the lower region DN2 may read resource information of the bank BK3.

Figure 8:
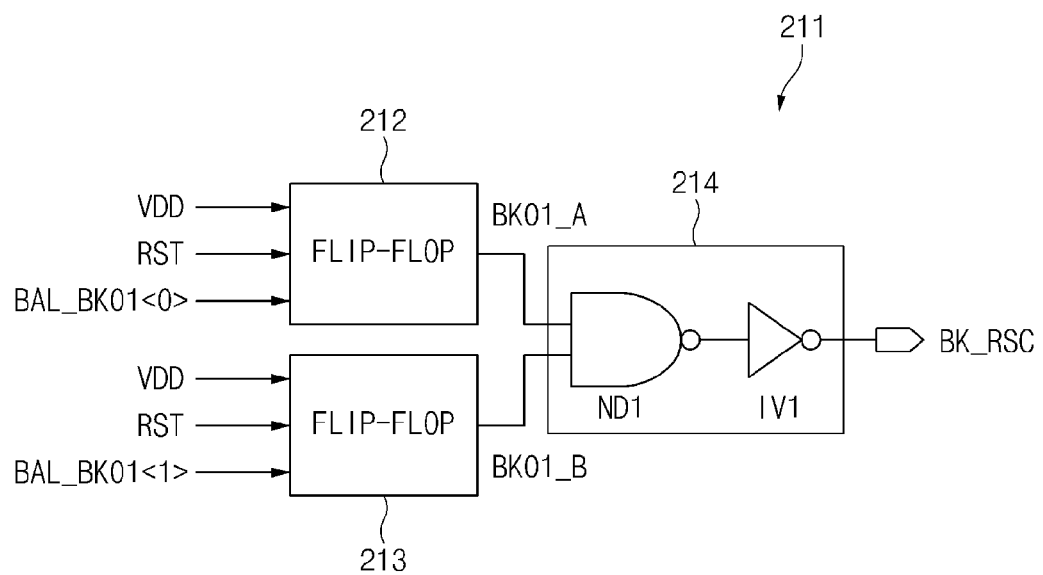
FIG. 8 is a detailed block diagram illustrating an example of a representation of a masking controller illustrated in FIG. 2.

FIG. 8 is a detailed block diagram illustrating an example of a representation of the masking controllers (211, 221, 231, 241) illustrated in FIG. 2. For convenience of description and better understanding of the present disclosure, the masking controller 211 from among the masking controllers (211, 221, 231, 241) will hereinafter be described as an example.

The masking controller 211 may include a plurality of flip-flops (212, 213) and a combination unit 214. The flip-flop 212 may flip-flop the power-supply voltage VDD, the reset signal RST, and the left upper bank selection signal BAL_BK01<0>. The masking controller 211 may output a detection signal BK01_A. The flip-flop 213 may flip-flop the power-supply voltage VDD, the reset signal RST, and the left lower bank selection signal BAL_BK01<1> so as to output a detection signal BK01_B.

The combination unit 214 may combine the detection signal BK01_A and the detection signal BK01_B to output a masking signal BK_RSC.

In an embodiment, if the detection signal BK01_A and the detection signal BK01_B are at a high level, the combination unit 214 may output a masking signal BK_RSC at a high level.

The combination unit 214 may include a NAND gate ND1 and an inverter IV1. The NAND gate ND1 may perform a NAND operation between the detection signal BK01_A and the detection signal BK01_B. The inverter IV1 may invert the output signal of the NAND gate ND1, and may output the masking signal BK_RSC.

Figure 9:
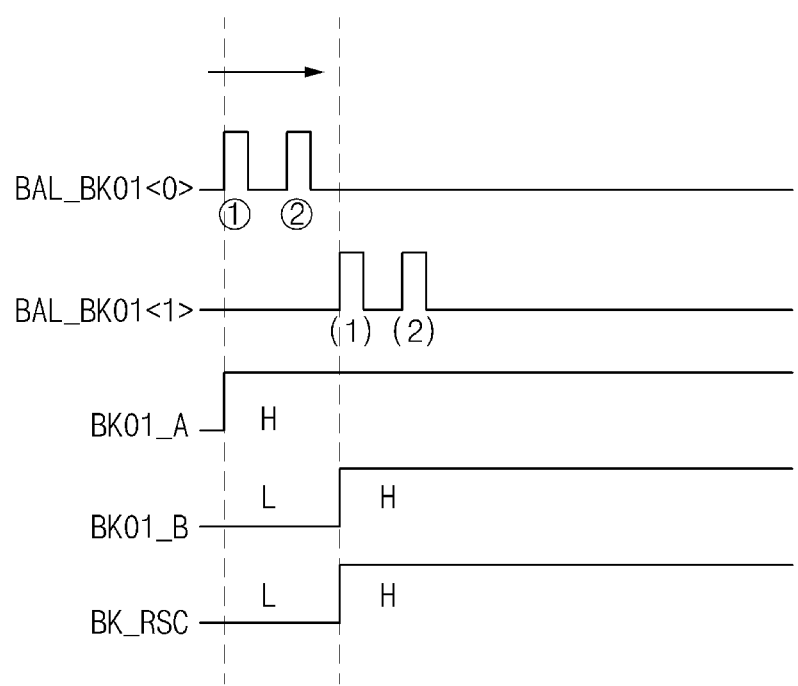
FIGS. 9 to 11 are timing diagrams illustrating examples of representations of the operations of a masking controller illustrated in FIG. 8.
Figure 10:
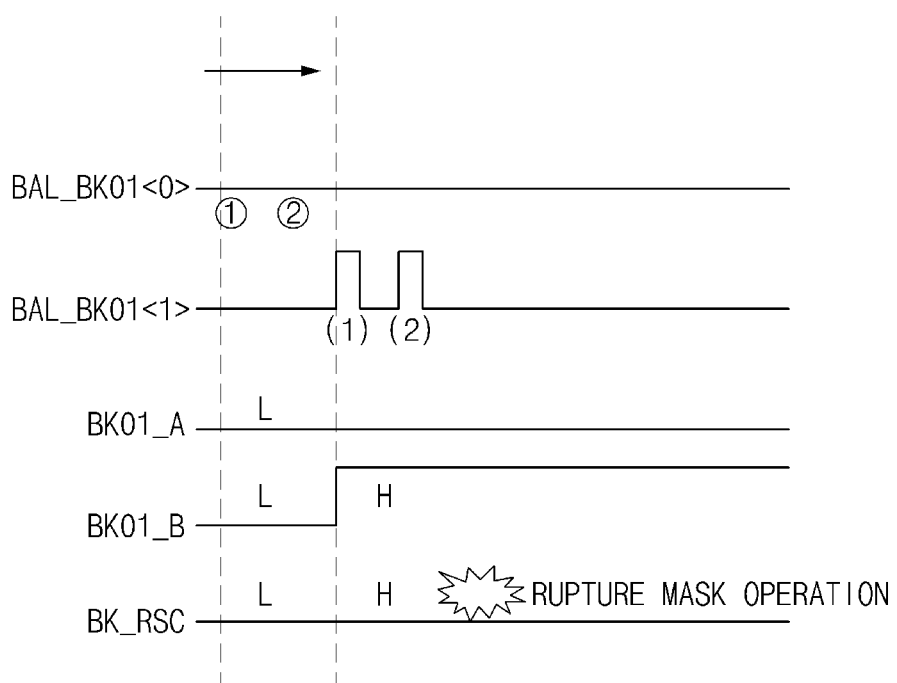
Figure 11:
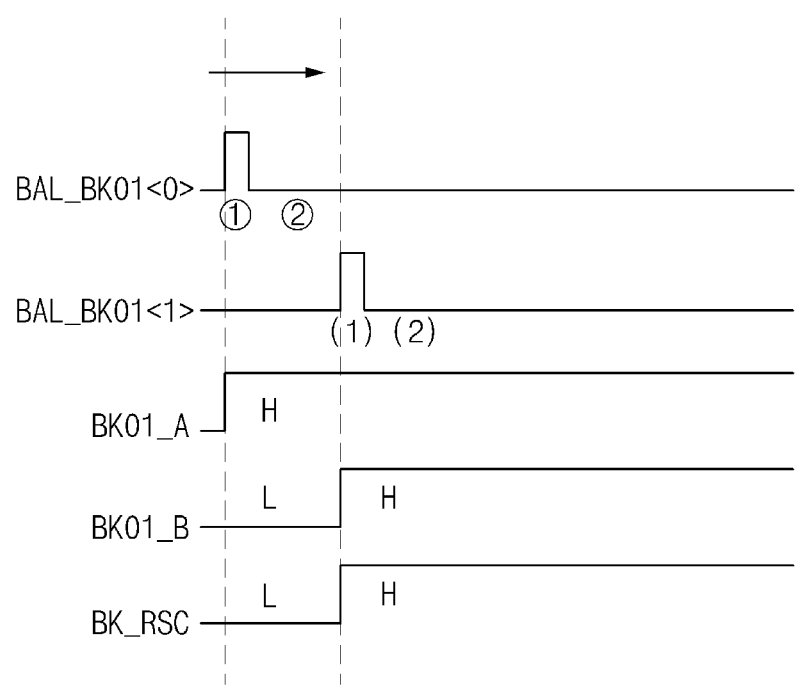

FIGS. 9 to 11 are timing diagrams illustrating examples of representations of the operations of the masking controller 211 illustrated in FIG. 8.

For example, as illustrated in FIG. 9, if the left upper bank selection signal BAL_BK01<0> is toggled and input to the flip-flop 212 of the masking controller 211, the flip-flop 212 may flip-flop the received signal so that the flip-flop 212 outputs the detection signal BK01_A at a high level. If the left lower bank selection signal BAL_BK01<1> is toggled and input to the flip-flop 213 of the masking controller 211, the flip-flop 213 may flip-flop the received signal so that the flip-flop 213 outputs the detection signal BK01_B at a high level.

If the detection signal (BK01_A) and the detection signal BK01_B are at a high level, the combination unit 214 may output the masking signal BK_RSC at a high level. If all fuses are not used, the combination unit 214 outputs the masking signal (BK_RSC) at a high level, so that information indicating the presence of unused fuses is output to the rupture controller 300.

Referring to FIG. 10, the left upper bank selection signal BAL_BK01<0> is not applied to the flip-flop 212 of the masking controller 211. In an embodiment, the detection signal BK01_A is output at a low level. If the left lower bank selection signal BAL_BK01<1> is toggled and input to the flip-flop 213 of the masking controller 211, the flip-flop 213 may flip-flop the received signal so that the flip-flop 213 outputs the detection signal BK01_B at a high level.

If the low-level detection signal (BK01_A) and the high-level detection signal BK01_B are input to the combination unit 214, the combination unit 214 may output the masking signal BK_RSC at a low level. All fuses of the upper region UP1 and all fuses of the lower region DN1 (i.e., fuses of upper mats (MAT0, MAT1)) are used, the combination unit 214 outputs the masking signal BK_RSC at a low level so that information indicating that all fuses are completely used is output to the rupture controller 300.

If the combination unit 214 outputs the masking signal BK_RSC at a low level, the rupture controller 300 determines that all fuses have been completely used. If all fuses are completely used, the remaining available fuses are not present, so that the rupture masking operation is carried out in such a manner that the rupture operation is not repeatedly performed.

Referring to FIG. 11, if the left upper bank selection signal BAL_BK01<0> is toggled and input to the flip-flop 212 of the masking controller 211, the flip-flop 212 may flip-flop the received signal so that the flip-flop 212 outputs the detection signal BK01_A at a high level. If the left lower bank selection signal BAL_BK01<1> is toggled once and input to the flip-flop 213 of the masking controller 211, the flip-flop 213 may flip-flop the received signal so that the flip-flop 213 outputs the detection signal BK01_B at a high level.

If the detection signal BK01_A and the detection signal BK01_B are at a high level, the combination unit 214 outputs the masking signal BK_RSC at a high level. One fuse of the upper region UP1 and one fuse of the lower region DN1 (i.e., one fuse of the upper mat MAT0 and one fuse of the upper mat MAT1) are respectively used, the combination unit 214 outputs the masking signal BK_RSC at a high level to prevent the rupture masking operation from being performed.

As is apparent from the above description, the post package repair device according to the embodiments of the present disclosure may have the following effects.

First, the post package repair (PPR) device according to the embodiments may output resource information of post-package-repairing fuses to an external part, may recognize whether to use the fuses, and may easily recognize the presence or absence of a malfunction.

Second, the post package repair (PPR) device according to the embodiments may display resources of the fuses needed for PPR according to respective banks, irrespective of the fuse replacement method.

Third, a total number of fuses are classified into a plurality of fuse groups, each of which includes a predetermined number of fuses, in a manner that each fuse can be independently allocated. Under these situations, the post package repair (PPR) device may display a maximum number of fuses capable of being used in each bank.

Fourth, assuming that the PPR operation is performed irrespective of PPR resources, the rupture masking operation may be performed to prevent the occurrence of repeated rupturing.

Figure 12:
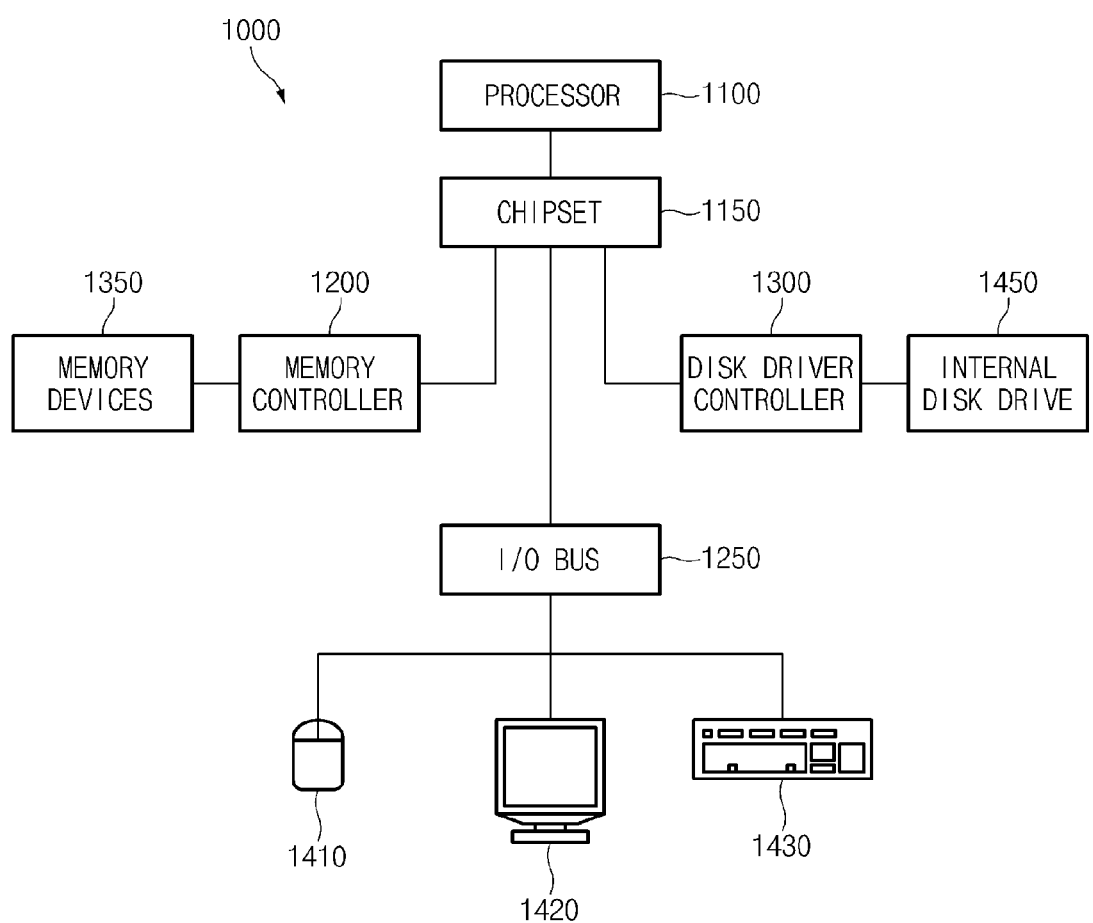
FIG. 12 illustrates a block diagram of an example of a representation of a system employing the post package repair device in accordance with the embodiments discussed above with relation to FIGS. 1-11.

The semiconductor device discussed above (see FIGS. 1-11) are particular useful in the design of memory devices, processors, and computer systems. For example, referring to FIG. 12, a block diagram of a system employing the post package repair device in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one post package repair device as discussed above with reference to FIGS. 1-11. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one post package repair device as discussed above with relation to FIGS. 1-11, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 12 is merely one example of a system employing the post package repair device as discussed above with relation to FIGS. 1-11. In alternate embodiments, such as cellular phones or digital cameras, the components may differ from the embodiments illustrated in FIG. 12.

Those skilled in the art will appreciate that the embodiments may be carried out in other specific ways than those set forth herein without departing from the spirit and essential characteristics of the application. The above embodiments are therefore to be construed in all aspects as illustrative and not restrictive.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A post package repair device comprising:
    a plurality of bank groups, each of the plurality of bank groups including fuses indicating repair information, configured to share a predetermined number of fuses; and
    a resource detection unit configured to store a fuse resource information, and determine the availability of the fuses from among the plurality of bank groups.

2. The post package repair device according to claim 1, wherein the resource detection unit is configured for scanning fuses unused in a boot-up operation, and for outputting the scanned fuses as resources.

3. The post package repair device according to claim 1, wherein a specific bank from among the plurality of bank groups is identified according to an arrangement order of the fuses.

4. The post package repair device according to claim 1, wherein the resource detection unit includes:
    a first bank from among the plurality of bank groups, configured to determine whether fuses arranged at a first line and a second line are used; and
    a second bank located adjacent to the first bank, configured to determine whether fuses arranged at a third line and a four line are used.

5. The post package repair device according to claim 1, wherein the resource detection unit is configured for classifying respective banks of the plurality of bank groups according to a specific mat unit, and for determining the presence or absence of resources of the fuses.

6. A post package repair device comprising:
    an Array Rupture Electrical fuse (ARE) array unit having a fuse array configured to store a failed address;
    a boot-up controller configured to scan the fuse array during a post package repair (PPR) operation, and to output fuse resource information;
    a resource detection unit configured to store the fuse resource information, and to output a resource signal indicating the availability of the fuse; and
    a rupture controller configured to control a rupture operation of the ARE array unit in response to the resource signal received from the resource detection unit.

7. The post package repair device according to claim 6, wherein the boot-up controller is configured to output pre-stored fuse resource information as 1-bit information using a mode register set.

8. The post package repair device according to claim 6, wherein the resource detection unit is configured to output the resource signal to a system in response to an output control signal received from the system.

9. The post package repair device according to claim 6, wherein the resource detection unit detects resource information of the corresponding region in response to a fuse address, a channel selection signal, a mat selection signal, a bank-group selection signal, and a bank selection signal, outputs a rupture control signal to the rupture controller in response to an output control signal received from a system, and outputs the resource signal to the system.

10. The post package repair device according to claim 6, further comprising:
    a plurality of bank groups, each of the plurality of bank groups including fuses indicating repair information, configured to share a predetermined number of fuses, to select, in response to a bank selection signal, a left bank or a right bank from among the bank groups.

11. The post package repair device according to claim 10, wherein the resource detection unit includes:
    a plurality of resource controllers configured to latch a fuse address in response to a channel selection signal, a mat selection signal, a bank group selection signal, and a bank selection signal, and to output a rupture control signal, the resource signal, and a selection signal having selection information of each channel;
    a plurality of output units configured to store the selection signal, and to selectively output a stored signal in response to an output control signal; and
    a latch unit configured to latch output signals of the plurality of output units, and to output a rupture control signal.

12. The post package repair device according to claim 11, wherein the output unit is configured to output the stored signal for each channel in response to the output control signal.

13. The post package repair device according to claim 11, wherein the latch unit is configured to reset stored resource detection information in response to a reset signal.

14. The post package repair device according to claim 11, wherein each of the resource controllers further includes:
    a masking controller configured to output a masking signal to the rupture controller,
    wherein the masking signal prevents a rupture operation from being repeatedly performed when there is no unused fuse.

15. The post package repair device according to claim 14, wherein the masking controller includes:
    a plurality of flip-flops configured to flip-flop the bank selection signal; and
    a combination unit configured to output the masking signal by combining output signals of the plurality of flip-flops.

16. The post package repair device according to claim 15, wherein the each flip-flop of the plurality of flip-flops are configured to receive a power supply voltage, the reset signal, and the bank selection signal, and output a detection signal,
    wherein the combination unit includes:
       a NAND logic gate configured for receiving the detection signals output from the plurality of flip-flops; and
       an inverter configured for receiving the output of the NAND logic gate and outputting the masking signal.

17. The post package repair device according to claim 11, wherein the number of the resource controllers is identical to the number of channels.

18. The post package repair device according to claim 11, wherein the plurality of resource controllers are configured to make a distinction among a per-channel region, a per-bank-group region, a per-left/right-bank region, and a per-mat region, and to output the resource signal according to a result of the distinction.

19. The post package repair device according to claim 18, wherein:
    two banks are classified into one bank group and share fuse lines,
    a first bank from among the plurality of bank groups is configured to determine whether a first fuse line and a second fuse line are used, and
    a second bank located adjacent to the first bank is configured to determine whether fuses arranged at a third line and a fourth line are used.

20. The post package repair device according to claim 18, wherein:
    two banks are classified into one bank group to classify an upper region and a lower region on a mat basis in response to the mat selection signal.

* * * * *